(12) United States Patent
Qing et al.

(10) Patent No.: US 9,318,540 B2
(45) Date of Patent: Apr. 19, 2016

(54) LIGHT EMITTING DIODE PIXEL UNIT CIRCUIT AND DISPLAY PANEL

(71) Applicants: BOE TECHNOLOGY GROUP CO., LTD., Beijing (CN); CHENGDU BOE OPTOELECTRONICS TECHNOLOGY CO., LTD., Chengdu, Sichuan Province (CN)

(72) Inventors: Haigang Qing, Beijing (CN); Xiaojing Qi, Beijing (CN)

(73) Assignees: BOE TECHNOLOGY GROUP CO., LTD., Beijing (CN); CHENGDU BOE OPTOELECTRONICS TECHNOLOGY CO., LTD., Chengdu (CN)

( * ) Notice: Subject to any disclaimer, the term of this patent is extended or adjusted under 35 U.S.C. 154(b) by 0 days.

(21) Appl. No.: 14/371,510

(22) PCT Filed: Aug. 5, 2013

(86) PCT No.: PCT/CN2013/080848
§ 371 (c)(1),
(2) Date: Jul. 10, 2014

(87) PCT Pub. No.: WO2014/190614
PCT Pub. Date: Dec. 4, 2014

(65) Prior Publication Data
US 2015/0053947 A1 Feb. 26, 2015

(30) Foreign Application Priority Data
May 29, 2013 (CN) .......................... 2013 1 0206508

(51) Int. Cl.
*H01L 27/32* (2006.01)
*G06F 3/044* (2006.01)
*G09G 3/32* (2006.01)

(52) U.S. Cl.
CPC .............. *H01L 27/323* (2013.01); *G06F 3/044* (2013.01); *G09G 3/32* (2013.01); *G09G 3/3233* (2013.01);
(Continued)

(58) Field of Classification Search
CPC ............... G09G 2300/0842; G09G 3/3233; G09G 2300/0852; G09G 2300/0809; G09G 2310/0262; G09G 3/325; G09G 3/3241; G09G 2300/0857; H01L 27/124; H01L 27/3244; H01L 27/3262; H01L 29/4908; H01L 29/786; H01L 27/3248; H01L 29/41733; G02F 1/136213
See application file for complete search history.

(56) References Cited

U.S. PATENT DOCUMENTS

2002/0093472 A1* 7/2002 Numao .......................... 345/87
2004/0056828 A1 3/2004 Choi et al.
(Continued)

FOREIGN PATENT DOCUMENTS

CN 1922470 A 2/2007
CN 1510652 A 7/2007
(Continued)

OTHER PUBLICATIONS

Translation of CN 102708792 A (published Oct. 3, 2012).*
(Continued)

*Primary Examiner* — Evan Pert
*Assistant Examiner* — Gustavo Ramallo (57) ABSTRACT

A LED pixel unit circuit and a display panel. The circuit comprises a driving module (31) which is provided with a driving control unit (311). The driving control unit (311) comprises a matching TFT (T4) whose threshold voltage is matched with the threshold voltage of the driving TFT (DTFT), is located between the first switching element (T1) and the first capacitor (C1), and is configured to control charging and discharging of the first capacitor (C1) so as to write the threshold voltage of the matching TFT (T4) and a new data voltage into the first capacitor (C1) while eliminating the original data voltage in the first capacitor (C1) and thereby compensate for the threshold voltage of the driving TFT (DTFT). The circuit can solve the problem of brightness non-uniformity of the display panel due to different threshold voltages of the TFTs, and also integrate a touch screen circuit into the pixel unit circuit to realize a touch function of the LED display panel.

18 Claims, 4 Drawing Sheets

(52) U.S. Cl.
CPC ........ *H01L 27/3262* (2013.01); *H01L 27/3265* (2013.01); *G09G 2300/043* (2013.01); *G09G 2300/0842* (2013.01); *G09G 2300/0861* (2013.01); *G09G 2300/0876* (2013.01); *G09G 2320/0233* (2013.01); *G09G 2354/00* (2013.01)

(56) References Cited

U.S. PATENT DOCUMENTS

| | | | |
|---|---|---|---|
| 2005/0052377 A1 | 3/2005 | Hsueh | |
| 2006/0267491 A1* | 11/2006 | Koo et al. | 313/511 |
| 2009/0015521 A1* | 1/2009 | Fish | 345/76 |
| 2009/0231241 A1* | 9/2009 | Abe | 345/76 |
| 2014/0055325 A1* | 2/2014 | Qi et al. | 345/76 |

FOREIGN PATENT DOCUMENTS

| | | | |
|---|---|---|---|
| CN | 102708792 A | * | 10/2012 |
| WO | 2013066017 A1 | | 5/2013 |

OTHER PUBLICATIONS

Office Action (Chinese) from the State Intellectual Property Office of the People's Republic of China in Chinese Patent Application No. 201310206508.2, dated Oct. 23, 2014; 6 pages.
English translation of Office Action from the State Intellectual Property Office of the People's Republic of China in Chinese Patent Application No. 201310206508.2, dated Oct. 23, 2014; 5 pages.
English Abstract of CN102708792A listed above under Foreign Patent Documents; 1 page.
PCT International Search Report for Application No. PCT/CN2013/080848, dated Feb. 27, 2014; 12 pages.
English Abstract of CN1510652A listed above under Foreign Patent Documents; 2 pages.
English Abstract of CN1922470A listed above under Foreign Patent Documents; 1 page.
English translation of the Abstract from CN1922470A listed above under Foreign Patent Documents; 1 page.
PCT International Preliminary Report on Patentability, for PCT/CN2013/080848, dated Dec. 1, 2015; 9 pages.

* cited by examiner

LIGHT EMITTING DIODE PIXEL UNIT CIRCUIT AND DISPLAY PANEL

CROSS REFERENCE TO RELATED APPLICATIONS

This application is based on International Application No. PCT/CN2013/080848 filed on Aug. 5, 2013, which claims priority to Chinese National Application No. 201310206508.2 filed on May 29, 2013. The entire contents of each and every foregoing application are incorporated herein by reference.

TECHNICAL FIELD OF THE DISCLOSURE

The present disclosure relates to the field of display technology, and particularly to a light emitting diode (LED) pixel unit circuit and a display panel.

BACKGROUND

Figure 1:
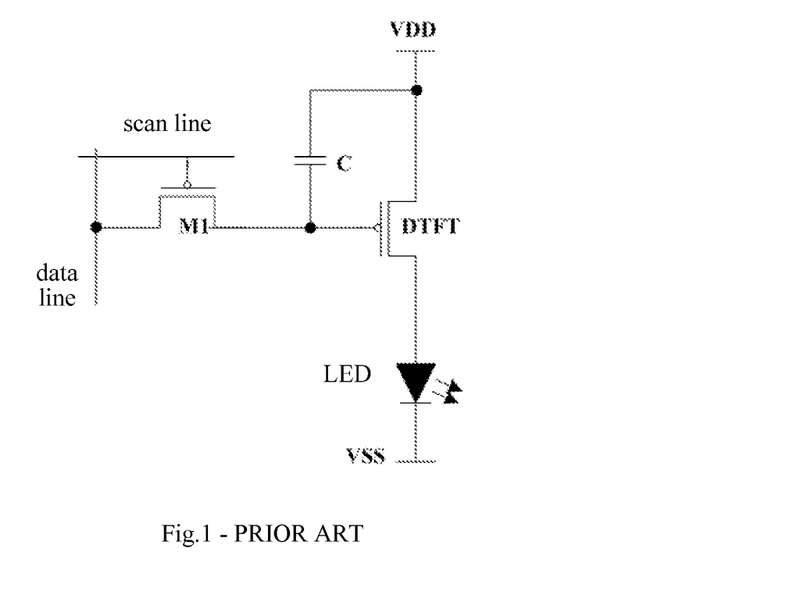
FIG. 1 is a 2T1C pixel driving circuit in the prior art.
Figure 2:
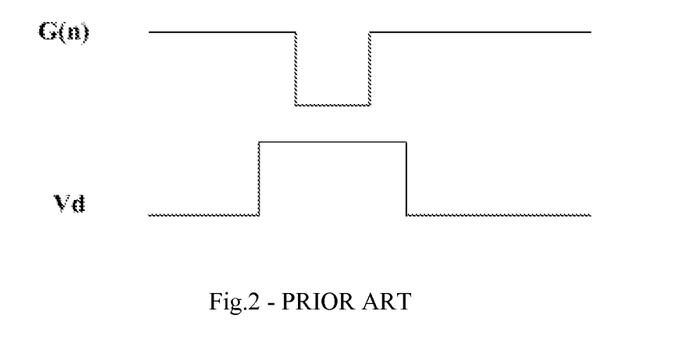
FIG. 2 is a timing diagram of signals at respective signal terminals of the 2T1C pixel driving circuit.

Compared with conventional liquid crystal panels, Active Matrix Organic Light Emitting Diode (AMOLED) display panels have many advantages such as high response speed, high contrast, wide visual angle, etc. The pixels of an AMOLED display panel are driven to emit light for displaying by related driving circuits on the array substrate. As shown in FIG. 1, a 2T1C pixel driving circuit in the prior art is shown. As can be seen from FIG. 1, the 2T1C pixel driving circuit in the prior art comprises two Thin Film Transistors (TFTs) and one capacitor, wherein the TFT M1 functions as a switch for controlling the connection between the data line and the gate of the TFT DTFT, the TFT DTFT is a driving TFT and can generate a driving current in the saturation state to drive the AMOLED to emit light. FIG. 2 is a timing diagram of the scan signal G(n) at the scan line and the gray-scale voltage signal Vd at the data line of the pixel driving circuit shown in FIG. 1. When the scan signal is at a low level, the TFT M1 is turned on and the gray-scale voltage Vd at the data line charges the capacitor C. When the scan signal is at a high level, the TFT M1 is turned off, the capacitor C is used to hold the gray-scale voltage. Since the voltage VDD of the power source is relatively high, the DTFT is at the saturation state. At this time, the driving current I of the OLED is I=K(Vsg−|Vth|)$^2$=K(VDD−Vdata−|Vth|)$^2$, where Vsg is the gate-source voltage of the DTFT, Vth is the threshold voltage of the DTFT, VDD is the positive voltage of the power source, Vd is the gray-scale voltage at the data line, K is a constant related to the transistor size and the carrier mobility which is determined by the TFT size and process.

However, in practical production process, even if the same process parameters are used, the threshold voltages of TFTs at different positions of the produced display panel may have large difference, such that the critical saturation voltages of the TFTs at different positions are also different, and thus the driving currents for OLEDs under the same gray-scale voltage are different. Therefore, the brightness at different positions of the display panel adopting this circuit would be different, resulting in poor brightness uniformity.

SUMMARY

According to embodiments of the present disclosure, there are provided a LED pixel unit circuit and a display panel to solve the problem of brightness non-uniformity of the display panel due to different threshold voltages of the TFTs.

According to an embodiment of the present disclosure, there is provided a LED pixel unit circuit comprising a driving module and a LED, wherein the driving module comprises a driving TFT, a first switching element, a second switching element, a first capacitor and a driving control unit.

The gate of the driving TFT is connected to a first node, the source of the driving TFT is connected to a positive voltage output terminal of a power source, and the drain of the driving TFT is connected to the anode of the LED. The cathode of the LED is connected to a negative voltage output terminal of the power source. The first capacitor is located between the first node and a second node as a first connection terminal of the driving control unit. The first switching element is connected between a third node as a second connection terminal of the driving control unit and a data line in series. The second switching element is connected between the positive voltage output terminal of the power source and the first node.

The driving control unit comprises a matching TFT whose threshold voltage is matched with the threshold voltage of the driving TFT, is located between the first switching element and the first capacitor, and is configured to control charging and discharging of the first capacitor so as to write the threshold voltage of the matching TFT and a new data voltage into the first capacitor while eliminating an original data voltage in the first capacitor and thereby compensate for the threshold voltage of the driving TFT.

In an example, the driving control unit also comprises a third switching element and a fifth switching element, wherein the third switching element is connected between the third node and the second node in series; the matching TFT functions as a fourth switching element, and is connected with the third switching element in parallel oppositely between the third node and the second node; and the fifth switching element is connected between the second node and a reference voltage output terminal in series.

In an example, the circuit also comprises a sensing module comprising a sixth switching element, a seventh switching element, a second capacitor, an amplifying TFT and a sensing element. The sixth switching element is connected between the first node and the gate of the amplifying TFT in series; the seventh switching element is connected between the drain of the amplifying TFT and a sensing line in series; the second capacitor is connected between the gate of the amplifying TFT and a control terminal of the seventh switching element in series; the sensing element is connected to the gate of the amplifying TFT; and the sensing module reuses the positive voltage of the power source and a scan signal in the driving module, and is configured to control charging and discharging of the second capacitor in the sensing module so as to make a touch signal by a finger be amplified by the amplifying TFT in the sensing module.

In an example, the first switching element to the seventh switching element are a first TFT to a seventh TFT respectively.

The gate of the first TFT is connected with a scan signal for a current row of pixels, the source of the first TFT is connected to the data line, and the drain of the first TFT is connected to the third node. The gate of the second TFT is connected with the scan signal for the current row of pixels, the source of the second TFT is connected to the positive voltage output terminal of the power source, and the drain of the second TFT is connected to the first node. The gate and the drain of the third TFT are connected to the second node together, and the source of the third TFT is connected to the third node. The gate and the drain of the fourth TFT are connected to the third node together, and the source of the fourth TFT is connected to the second node. The gate of the fifth TFT is connected with the control signal for the current row of pixels, the source of the fifth TFT is connected to the second node, and the drain of the fifth TFT is connected to the reference voltage output terminal.

The gate of the sixth TFT is connected with the scan signal for the current row of pixels, the source of the sixth TFT is connected to the first node, and the drain of the sixth TFT is connected to the gate of the amplifying TFT. The gate of the seventh TFT is connected with a scan signal for a next row of pixels, the source of the seventh TFT is connected to the drain of the amplifying TFT, and the drain of the seventh TFT is connected to the sensing line. The gate of the amplifying TFT is connected to the drain of the sixth TFT, the source of the amplifying TFT is connected with the positive voltage output terminal of the power source, and the drain of the amplifying TFT is connected to the source of the seventh TFT.

In an example, the fourth TFT is the same as the driving TFT in terms of size and shape. In practical process, the fourth TFT T4 can be placed at a position close to the driving TFT DTFT to compensate for the threshold voltage Vthd of the driving TFT and thus eliminate the influence of the threshold voltage of the driving TFT on the driving current based on the principle that two TFTs with the same design inside the same pixel have matched electric characteristics since they have very close positions and very similar process environments; therefore they have very small difference in electric characteristics caused by the process. Their electric characteristics can be regarded approximately the same. In other words, the threshold voltage of the fourth TFT is approximately the same as the threshold voltage of the driving TFT.

In an example, all of the TFTs are P type TFTs.

In an example, all of the above TFTs are poly silicon TFTs or amorphous silicon TFTs or oxide TFTs.

In an example, the sensing element is a sensing electrode, and is configured to form induced capacitance between the sensing electrode and a body of a person when the person touches the sensing electrode.

According to another embodiment of the present disclosure, there is provided a display panel comprising a LED pixel unit circuit as described in the above.

The pixel unit circuit provided by an embodiment of the present disclosure comprises the driving module and the sensing module. The driving module is provided with the driving TFT, the first switching element, the first capacitor, the second switching element and the driving control unit. The driving current for driving the LED to emit light is made not to be influenced by the threshold voltage of the driving TFT, by controlling the charging and discharging of the first capacitor through the driving control unit so as to write the threshold voltage of the matching TFT and a new data voltage into the first capacitor while eliminating the original data voltage and thereby compensate for the threshold voltage of the driving TFT. At the same time, a reference voltage is introduced by the driving module. Since the reference voltage source operates only as a reference to provide the level reference for the first node but no continuous current flows through the wiring lines, the internal resistance of the wiring lines does not cause the reference level to drop its potential when arriving at the first node. Therefore, the reference voltage is a constant voltage value in the current equations whether the circuit is at the operation stage or at the non-operation stage, such that the influence of the internal resistance of the wiring lines on the light emitting circuit is eliminated. As a result, the driving currents for LEDs in the pixel circuit coincide under the same gray-scale voltage, the brightness of the display panel adopting this circuit would not be different, and thus the brightness uniformity of the display panel is improved.

DETAILED DESCRIPTION

In embodiments of the present disclosure, there are provided a LED pixel unit circuit and a display panel to solve the problem of brightness non-uniformity of the display panel due to different threshold voltages of the driving TFTs.

In the following, the present disclosure is described in connection with the figures.

Figure 3:
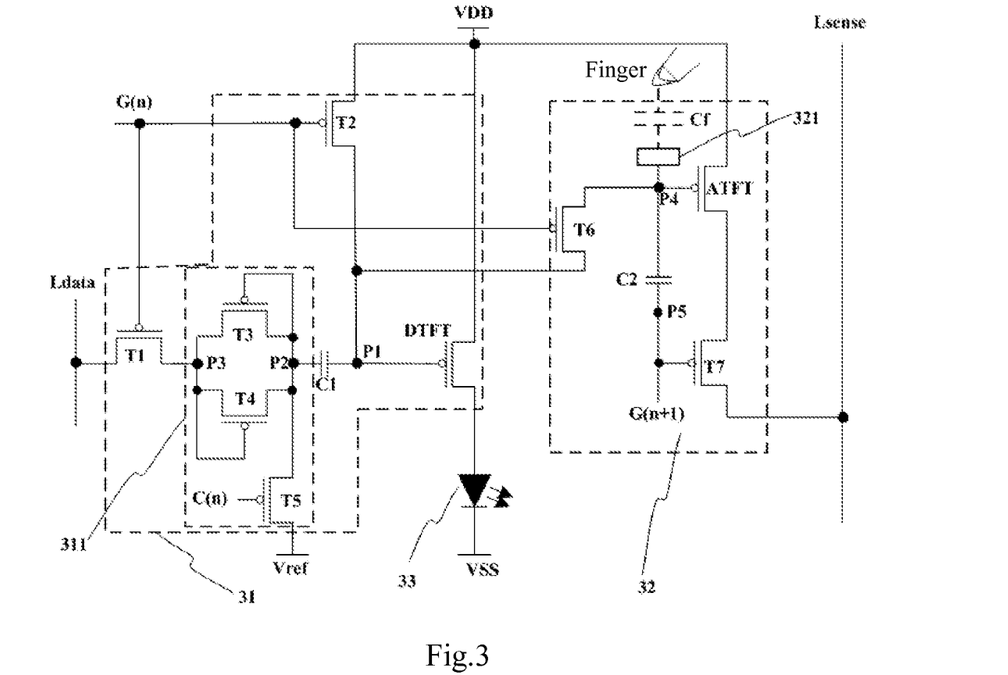
FIG. 3 is a circuit diagram of a pixel driving circuit provided by an embodiment of the present disclosure.

Referring to FIG. 3, an AMOLED pixel unit circuit provided by an embodiment of the present disclosure is shown. The AMOLED pixel unit circuit comprises a driving module 31, a sensing module 32 and a LED 33.

In particular, the driving module 31 comprises a driving TFT DTFT, a first TFT T1, a second TFT T2, a first capacitor C1 and a driving control unit 311, wherein the driving control unit 311 comprises a third TFT T3, a fourth TFT T4 and a fifth TFT T5.

The gate of the driving TFT DTFT is connected to a first node P1, the source of the driving TFT DTFT is connected with a positive voltage VDD output terminal of a power source, and the drain of the driving TFT DTFT is connected to the anode of the AMOLED.

The first capacitor C1 is located between the first node P1 and a second node P2.

The gate of the first TFT T1 is connected with a scan signal G(n) for a current row of pixels, the source of the first TFT T1 is connected to the data line Ldata, and the drain of the first TFT T1 is connected to a third node P3.

The gate of the second TFT T2 is connected with the scan signal G(n) for the current row of pixels, the source of the second TFT T2 is connected to the positive voltage VDD output terminal of the power source, and the drain of the second TFT T2 is connected to the first node P1.

The gate and the drain of the third TFT T3 are connected to the second node P2 together, and the source of the third TFT T3 is connected to the third node P3.

The gate and the drain of the fourth TFT are connected to the third node P3 together, and the source of the fourth TFT T4 is connected to the second node P2.

The gate of the fifth TFT T5 is connected with a control signal C(n) for the current row of pixels, the source of the fifth TFT T5 is connected to the second node P2, and the drain of the fifth TFT T5 is connected to the reference voltage output terminal Vref.

In particular, the sensing module 32 comprises a sixth TFT T6, a seventh TFT T7, an amplifying TFT ATFT, a second capacitor C2, and a sensing electrode 321.

The gate of the sixth TFT T6 is connected with the scan signal G(n) for the current row of pixels, the source of the sixth TFT T6 is connected to the first node P1, and the drain of the sixth TFT T6 is connected to the gate of the amplifying TFT ATFT.

The gate of the seventh TFT T7 is connected with a scan signal G(n+1) for the next row of pixels, the source of the seventh TFT T7 is connected to the drain of the amplifying TFT ATFT, and the drain of the seventh TFT ATFT is connected to the sensing line Lsense.

The second capacitor C2 is connected between the gate of the amplifying TFT ATFT and the gate of the seventh TFT T7.

The sensing electrode 321 is connected to the gate of the amplifying TFT ATFT, and is configured to form induced capacitance Cf between the sensing electrode 321 and a body of a person when the person touches the sensing electrode 321, so as to cause change in the potential of the gate of the ATFT and thus generate changed sensing current.

In addition, the anode of the AMOLED is connected to the drain of the driving TFT DTFT, and the cathode of the AMOLED is connected with the negative voltage VSS of the power source.

Figure 4:
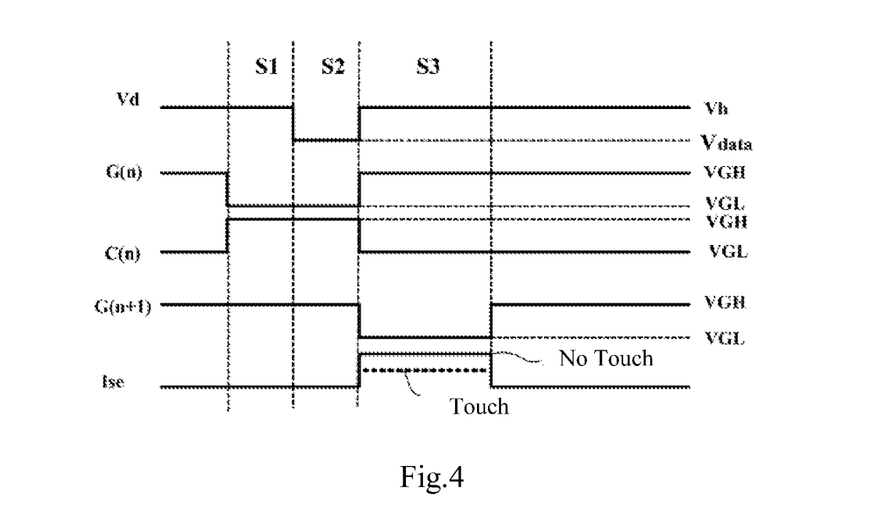
FIG. 4 is a timing diagram of signals at respective signal terminals of the pixel driving circuit provided by the embodiment of the present disclosure.

FIG. 4 is a timing diagram of signals at respective signal terminals. Next, the operation method of the AMOLED pixel unit circuit provided by the embodiment of the present disclosure will be described in connection with FIG. 4, in which all of the TFTs are turned on by a low level and turned off by a high level.

Figure 5:
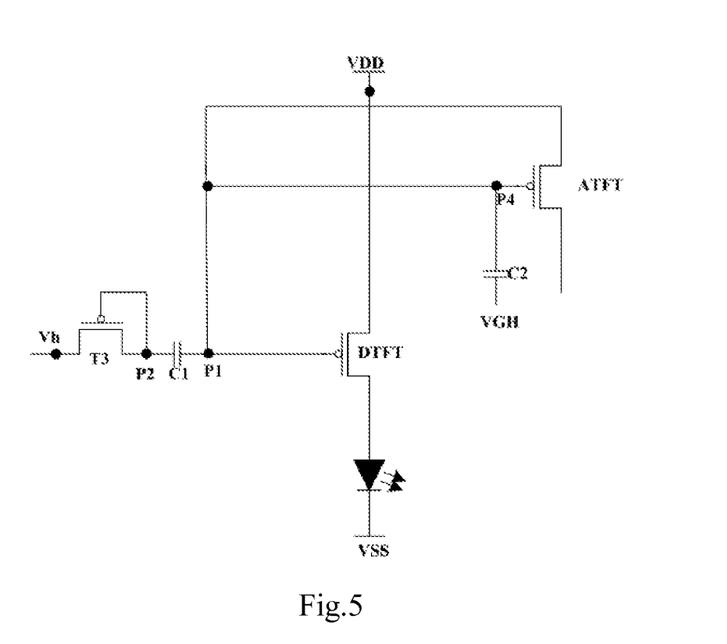
FIG. 5 is an equivalent circuit diagram of the pixel driving circuit provided by the embodiment of the present disclosure at a first stage.

At a first stage S1, referring to FIG. 5 which is an equivalent circuit diagram at this stage, the scan signal G(n+1) for the next row of pixels is at a high level VGH, such that the seventh TFT T7 responding to the scan signal G(n+1) for the next row of pixels is turned off, and thus the drain of the amplifying TFT ATFT is at a floating state.

The scan signal G(n) for the current row of pixels is at a low level VGL, and the control signal C(n) for the current row of pixels is at a high level VGH, such that the first TFT T1, the second TFT T2 and the sixth TFT T6 are turned on, and the fifth TFT T5 is turned off. A gray-scale voltage signal Vd is outputted at the data line, and corresponds to a gray-scale voltage of Vh which is at a high level, and thus the fourth TFT T4 is turned off. Because the potential at the second node P2 is relatively low, and thus the third TFT T3 is turned on. At the same time, the voltage Vh at the data line charges the first capacitor C1 through the first TFT T1 and the third TFT T3 such that the potential at the second node P2 is raised to Vh−|Vth3|, where |Vth3| is the threshold voltage of the third TFT T3. The positive voltage VDD of the power source charges the first capacitor C1 through the second TFT T2 such that the potential at the first node P1 is raised to VDD. At the same time, the positive voltage VDD of the power source charges the second capacitor C2 to raise the potential at the fourth node P4 (i.e., at the gate of the amplifying TFT ATFT) to VDD.

Meanwhile, the potential at the fifth node P5 is raised to VGH since the scan signal G(n+1) for the next row of pixels is at a high level VGH.

Figure 6:
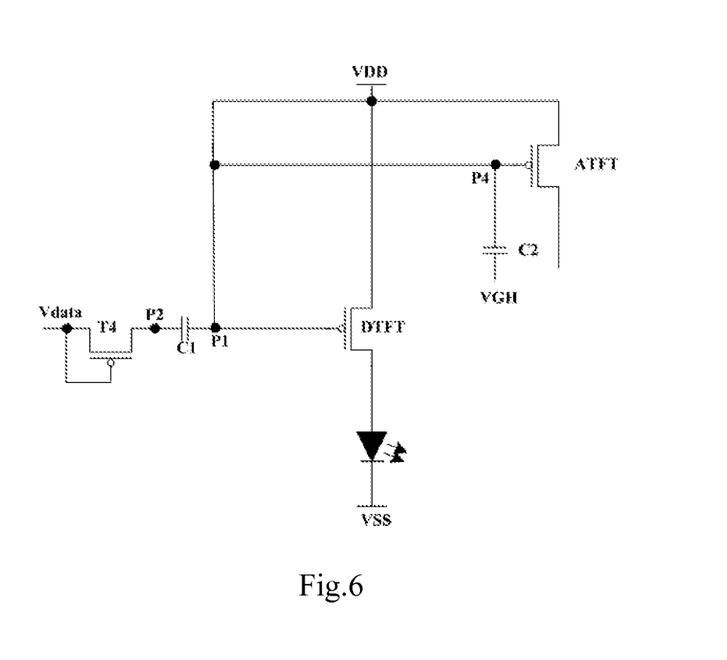
FIG. 6 is an equivalent circuit diagram of the pixel driving circuit provided by the embodiment of the present disclosure at a second stage.

At a second stage S2, referring to FIG. 6 which is an equivalent circuit diagram at this stage, G(n) remains at the low level, C(n) and G(n+1) remain at the high level, and the voltage at the data line jumps from the high level Vh to the low level Vdata. Therefore, the first TFT T1, the second TFT T2 and the sixth TFT T6 remain to be turned on, the fifth TFT T5 is turned off and the seventh TFT T7 remains to be turned off. Since the first capacitor C1 is charged at the previous stage to raise the potential at the second node P2 to Vh−|Vth3|, after the voltage at the data line jumps to Vdata, the potential at the third node P3 decreases, such that the third TFT T3 is turned off, the fourth TFT T4 is turned on, and the first capacitor C1 is discharged gradually through the fourth TFT T4. When the potential at the third node P3 drops to Vdata+|Vth4| where |Vth4| is the threshold voltage of the fourth TFT T4, the fourth TFT T4 is turned off.

At this time, the voltage Vc1 between the two terminals of the first capacitor is Vc1=VDD−(Vdata+|Vth4|); the voltage Vc2 between the two terminals of the second capacitor is Vc2=VDD−VGH.

Figure 7:
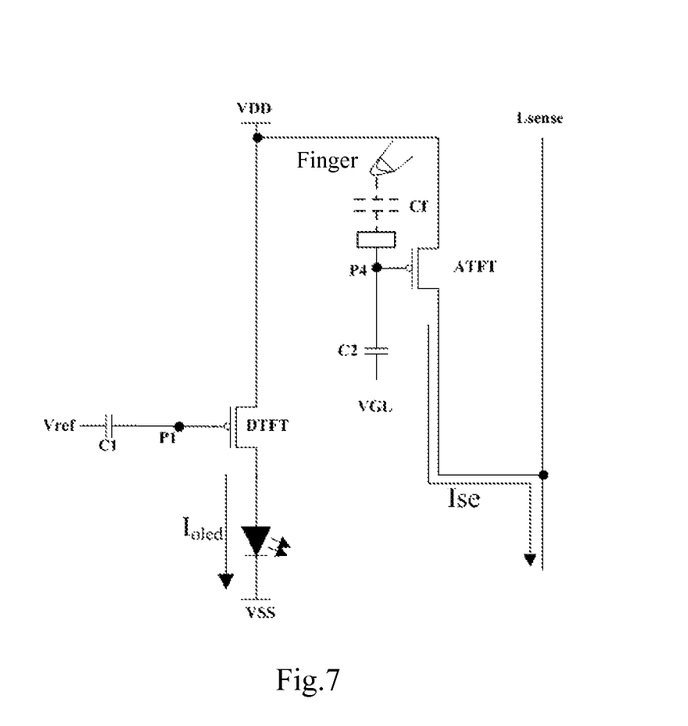
FIG. 7 is an equivalent circuit diagram of the pixel driving circuit provided by the embodiment of the present disclosure at a third stage.

At a third stage S3, referring to FIG. 7 which is an equivalent circuit diagram at this stage, G(n) jumps to the high level VGH, and C(n) jumps to the low level. The first TFT T1, the second TFT T2 and the sixth TFT T6 are turned off. The fifth TFT T5 is turned on. Since the first node P1 is at the floating state, the potential at the capacitor C1 remains to be unchanged. However, since the fifth TFT T5 is turned on, the potential at the second node P2 is raised to Vref. Further, due to the coupling effect of the first capacitor, the potential at the first node P1, i.e., at the gate of the driving TFT DTFT, also changes. At this time, the potential at the gate of the driving TFT DTFT is:

$$Vg = Vp1 = VDD + Vref - (Vdata + |Vth4|)$$

where Vg is the potential at the gate of the driving TFT DTFT, Vp1 is the potential at the first node, and Vref is the reference voltage.

The gate-source voltage of the driving TFT DTFT is:

$$\begin{aligned} Vsg &= Vs - Vg \\ &= VDD - (VDD + Vref - (Vdata + |Vth4|)) \\ &= Vdata + |Vth4| - Vref; \end{aligned}$$

where Vsg is the gate-source voltage of the driving TFT DTFT and Vs is the source voltage of the driving TFT DTFT.

Since the fourth TFT T4 is the matching TFT of the driving TFT DTFT, and their threshold voltages are approximately the same, the saturation current through the driving TFT DTFT, i.e. the light emitting current $I_{oled}$ of the AMOLED, is:

$$\begin{aligned} I_{oled} &= K_d(Vsg - |Vthd|)^2 \\ &= K_d(Vdata + |Vth4| - Vref - |Vthd|)^2 \\ &= K_d(Vdata - Vref)^2 \end{aligned}$$

where $K_d$ is a constant related to the process and driving design.

In addition, G(n+1) jumps to the low level VGL to turn on the seventh TFT T7. Since the sixth TFT T6 is turned off, the gate of the amplifying TFT AFTF is floating. Therefore, when the potential of G(n+1) jumps to the low level, the potential at the fourth node P4, i.e. the gate potential of the amplifying TFT ATFT, follows to jump down through the coupling effect of the second capacitor C2. The amplitude of change in the gate potential of the amplifying TFT ATFT is related to whether touch action occurs on the sensing electrode 321 connected to the gate of the amplifying TFT ATFT.

When touch action occurs on the sensing electrode 321, since coupling capacitance Cf would be formed between the body of the person and the sensing electrode 321, the potential Vp4 at the fourth node P4 is:

$$Vp4 = [VDD + (VGL - VGH)] * C2/(C2 + Cf),$$

where Vp4 is the potential at the fourth node P4.

Now the voltage $V_1sg$ between the source and the gate of the amplifying TFT ATFT is:

$$V_1sg = Vs - Vg$$
$$= Vs - Vp4$$
$$= VDD - [[VDD + (VGL - VGH)] * C2/(C2 + Cf)]$$
$$= VDD * Cf/(C2 + Cf) + (VGH - VGL) * C2/(C2 + Cf).$$

Accordingly, the sensing current Ise through the sensing line Lsense now is:

$$Ise = Ka(Vsg - |Vtha|)^2$$
$$= Ka(V_1sg - |Vtha|)^2$$
$$= Ka[VDD * Cf/(C2 + Cf) + (VGH - VGL) *$$
$$C2/(C2 + Cf) - |Vtha|]^2,$$

where Vtha is the threshold voltage of the amplifying TFT, and Ka is a constant of the amplifying TFT related to the process and design.

When no touch action occurs on the sensing electrode 321, the potential at the fourth node P4 is:

$$Vp4 = VDD - (VGH - VGL).$$

Now, the voltage $V_2sg$ between the source and the gate of the amplifying TFT ATFT is:

$$V_2sg = Vs - Vg$$
$$= Vs - Vp4$$
$$= VDD - [VDD - (VGH - VGL)]$$
$$= VGH - VGL.$$

Accordingly, the sensing current Ise through the sensing line Lsense now is:

$$Ise = Ka(Vsg - |Vtha|)^2$$
$$= Ka(V_2sg - |Vtha|)^2$$
$$= Ka[(VGH - VGL) - |Vtha|]^2.$$

In conclusion, when touch action occurs, the voltage between the source and the gate of the amplifying TFT ATFT decreases due to the voltage division effect of the coupling capacitance Cf, and the amplification capability of the amplifying TFT ATFT decreases, such that the sensing current Ise generated when touch action occurs is smaller than the sensing current Ise generated when no touch action occurs. Therefore, in the circuit, it is possible to determine whether there is touch action at the present location only by the sensing current.

According to another embodiment of the present disclosure, there is also provided a display panel comprising an AMOLED pixel unit circuit as described in the above.

In conclusion, the AMOLED pixel unit circuit provided by the embodiment of the present disclosure comprises the driving module and the LED. The driving module is provided with the driving TFT, the first switching element, a first capacitor, a second switching element and a driving control unit. The driving current for driving the LED to emit light is made not to be influenced by the threshold voltage of the driving TFT, by controlling the charging and discharging of the first capacitor through the driving control unit so as to write the threshold voltage of the matching TFT and a new data voltage into the first capacitor while eliminating the original data voltage and in turn compensate for the threshold voltage of the driving TFT. At the same time, the influence of the internal resistance of the wiring lines on the light emitting circuit is eliminated by introducing a reference voltage through the driving module, such that the driving currents for AMOLEDs in the pixel circuit coincide under the same grayscale voltage, the brightness of the display panel adopting this circuit would not be different, and the brightness uniformity of the display panel is improved. Further, in the present disclosure, the sensing module is integrated in the circuit, the positive voltage VDD of the power source in the driving module and the scan signals G(n) and G(n+1) for the current row and the next row of pixels are reused to control the charging and discharging of the second capacitor in the sensing module, such that the finger touch signal can be amplified by the amplifying TFT. The touch function of the display panel is well realized without increasing the complexity of the circuit structure and operation. In addition, in the circuit, only P type TFTs are used, thereby reducing the complexity and cost of the fabrication process.

It is noted that although description is made by taking an example of only using P type TFTs in the above embodiments, the above circuit can be easily changed to a circuit only using N type TFTs or CMOS transistors. In addition, the touch function part can be removed to change the driving touch circuit as a pure pixel light-emitting driving circuit. Further, although description is made by taking the AMOLED as an example in the above embodiments, the present disclosure is not limited to the display apparatus using AMOLEDs, but can be applied to display apparatus using other various LEDs.

Obviously, those skilled in the art may make various modifications and variations without departing from the spirit and scope of the present disclosure. The present disclosure is also intended to contain those modifications and variations as long as those modifications and variations of the present disclosure fall within the scope of the claims and equivalents thereof of the present disclosure.

What is claimed is:

1. A LED pixel unit circuit comprising a driving module and a LED, the driving module comprising a driving TFT, a first switching element, a second switching element, a first capacitor and a driving control unit, wherein
    a gate of the driving TFT is connected to a first node, a source of the driving TFT is connected to a positive voltage output terminal of a power source, and a drain of the driving TFT is connected to an anode of the LED;
    a cathode of the LED is connected to a negative voltage output terminal of the power source;
    the first capacitor is located between the first node and a second node as a first connection terminal of the driving control unit;
    the first switching element is connected between a third node as a second connection terminal of the driving control unit and a data line in series;
    the second switching element is connected between the positive voltage output terminal of the power source and the first node; and the driving control unit comprises a matching TFT whose threshold voltage is matched with the threshold voltage of the driving TFT, is located between the first switching element and the first capacitor, and is configured to control charging and discharging of the first capacitor so as to write the threshold voltage of the matching TFT and a new data voltage into the first capacitor while eliminating the original data voltage in the first capacitor, and thereby compensate for the threshold voltage of the driving TFT.

2. The circuit of claim 1, wherein the driving control unit also comprises a third switching element and a fifth switching element, the third switching element is connected between the third node and the second node in series;

the matching TFT functions as a fourth switching element, and is connected with the third switching element in parallel oppositely between the third node and the second node; and the fifth switching element is connected between the second node and a reference voltage output terminal in series.

3. The circuit of claim 2, wherein the circuit also comprises a sensing module comprising a sixth switching element, a seventh switching element, a second capacitor, an amplifying TFT and a sensing element;

the sixth switching element is connected between the first node and a gate of the amplifying TFT in series;

the seventh switching element is connected between a drain of the amplifying TFT and a sensing line in series;

the second capacitor is connected between the gate of the amplifying TFT and a control terminal of the seventh switching element in series;

the sensing element is connected to the gate of the amplifying TFT; and the sensing module is configured to control charging and discharging of the second capacitor in the sensing module so as to make a touch signal by a finger be amplified by the amplifying TFT in the sensing module.

4. The circuit of claim 3, wherein the first switching element to the seventh switching element are a first TFT to a seventh TFT respectively.

5. The circuit of claim 4, wherein a gate of the first TFT is connected with a scan signal for a current row of pixels, a source of the first TFT is connected to the data line, and a drain of the first TFT is connected to the third node;

a gate of the second TFT is connected with the scan signal for the current row of pixels, a source of the second TFT is connected to the positive voltage output terminal of the power source, and a drain of the second TFT is connected to the first node;

a gate and a drain of the third TFT are connected to the second node together, and a source of the third TFT is connected to the third node;

a gate and a drain of the fourth TFT are connected to the third node together, and a source of the fourth TFT is connected to the second node; and a gate of the fifth TFT is connected with a control signal for the current row of pixels, a source of the fifth TFT is connected to the second node, and a drain of the fifth TFT is connected to the reference voltage output terminal.

6. The circuit of claim 5, wherein a gate of the sixth TFT is connected with the scan signal for the current row of pixels, a source of the sixth TFT is connected to the first node, and a drain of the sixth TFT is connected to the gate of the amplifying TFT;

a gate of the seventh TFT is connected with a scan signal for a next row of pixels, a source of the seventh TFT is connected to the drain of the amplifying TFT, and a drain of the seventh TFT is connected to the sensing line; and the gate of the amplifying TFT is connected to the drain of the sixth TFT, the source of the amplifying TFT is connected with the positive voltage of the power source, and the drain of the amplifying TFT is connected to the source of the seventh TFT.

7. The circuit of claim 4, wherein all of the TFTs are P type TFTs.

8. The circuit of claim 3, wherein the sensing element is a sensing electrode, and is configured to form induced capacitance between the sensing electrode and a body of a person when the person touches the sensing electrode.

9. The circuit of claim 4, wherein the fourth TFT is the same as the driving TFT in terms of size and shape.

10. A display panel, characterized by comprising a LED pixel unit circuit according to claim 1.

11. The display panel of claim 10, wherein the driving control unit also comprises a third switching element and a fifth switching element, the third switching element is connected between the third node and the second node in series;

the matching TFT functions as a fourth switching element, and is connected with the third switching element in parallel oppositely between the third node and the second node; and the fifth switching element is connected between the second node and a reference voltage output terminal in series.

12. The display panel of claim 11, wherein the circuit also comprises a sensing module comprising a sixth switching element, a seventh switching element, a second capacitor, an amplifying TFT and a sensing element;

the sixth switching element is connected between the first node and a gate of the amplifying TFT in series;

the seventh switching element is connected between a drain of the amplifying TFT and a sensing line in series;

the second capacitor is connected between the gate of the amplifying TFT and a control terminal of the seventh switching element in series;

the sensing element is connected to the gate of the amplifying TFT; and the sensing module is configured to control charging and discharging of the second capacitor in the sensing module so as to make a touch signal by a finger be amplified by the amplifying TFT in the sensing module.

13. The display panel of claim 12, wherein the first switching element to the seventh switching element are a first TFT to a seventh TFT respectively.

14. The display panel of claim 13, wherein a gate of the first TFT is connected with a scan signal for a current row of pixels, a source of the first TFT is connected to the data line, and a drain of the first TFT is connected to the third node;

a gate of the second TFT is connected with the scan signal for the current row of pixels, a source of the second TFT is connected to the positive voltage output terminal of the power source, and a drain of the second TFT is connected to the first node;

a gate and a drain of the third TFT are connected to the second node together, and a source of the third TFT is connected to the third node;

a gate and a drain of the fourth TFT are connected to the third node together, and a source of the fourth TFT is connected to the second node; and a gate of the fifth TFT is connected with a control signal for the current row of pixels, a source of the fifth TFT is connected to the second node, and a drain of the fifth TFT is connected to the reference voltage output terminal.

15. The display panel of claim 14, wherein a gate of the sixth TFT is connected with the scan signal for the current row of pixels, a source of the sixth TFT is connected to the first node, and a drain of the sixth TFT is connected to the gate of the amplifying TFT;

a gate of the seventh TFT is connected with a scan signal for a next row of pixels, a source of the seventh TFT is connected to the drain of the amplifying TFT, and a drain of the seventh TFT is connected to the sensing line; and the gate of the amplifying TFT is connected to the drain of the sixth TFT, the source of the amplifying TFT is connected with the positive voltage of the power source, and the drain of the amplifying TFT is connected to the source of the seventh TFT.

16. The display panel of claim 13, wherein all of the TFTs are P type TFTs.

17. The display panel of claim 12, wherein the sensing element is a sensing electrode, and is configured to form induced capacitance between the sensing electrode and a body of a person when the person touches the sensing electrode.

18. The display panel of claim 13, wherein the fourth TFT is the same as the driving TFT in terms of size and shape.

* * * * *